(12) United States Patent
Maeda

(10) Patent No.: US 8,450,617 B2
(45) Date of Patent: May 28, 2013

(54) MULTILAYER WIRING SUBSTRATE

(75) Inventor: Shinnosuke Maeda, Nagoya (JP)

(73) Assignee: NGK Spark Plug Co., Ltd., Nagoya (JP)

(*) Notice: Subject to any disclaimer, the term of this patent is extended or adjusted under 35 U.S.C. 154(b) by 81 days.

(21) Appl. No.: 13/288,497

(22) Filed: Nov. 3, 2011

(65) Prior Publication Data

US 2012/0111624 A1 May 10, 2012

(30) Foreign Application Priority Data

Nov. 4, 2010 (JP) ................................ 2010-247114

(51) Int. Cl.
*H05K 1/03* (2006.01)
(52) U.S. Cl.
USPC ............ 174/255; 174/257; 174/258; 174/260
(58) Field of Classification Search
USPC ........................ 174/250, 255, 257, 258, 260
See application file for complete search history.

(56) References Cited

U.S. PATENT DOCUMENTS

| | | | |
|---|---|---|---|
| 2005/0183882 A1* | 8/2005 | Yun et al. ...................... | 174/250 |
| 2007/0012475 A1* | 1/2007 | Kawaguchi et al. .......... | 174/255 |
| 2007/0119619 A1 | 5/2007 | Nakamura et al. | |
| 2008/0251285 A1* | 10/2008 | Sato et al. ..................... | 174/260 |
| 2008/0308304 A1* | 12/2008 | Nakamura et al. ............ | 174/255 |
| 2009/0114429 A1* | 5/2009 | Sri-Jayantha et al. ........ | 174/255 |
| 2010/0025093 A1* | 2/2010 | Maruyama et al. ........... | 174/258 |

FOREIGN PATENT DOCUMENTS

JP 2007-096260 A 4/2007

\* cited by examiner

*Primary Examiner* — Hoa C Nguyen
(74) *Attorney, Agent, or Firm* — Stites & Harbison PLLC; Jeffrey A. Haeberlin

(57) ABSTRACT

A multilayer wiring substrate has a main face and a back face, and a configuration in which a plurality of resin insulation layers and a plurality of conductor layers are laminated. A plurality of conductor layers provided on the side toward the back face in relation to a resin insulation layer serving as a center layer are formed such that the average of their area ratios becomes greater than the average of area ratios of a plurality of conductor layers provided on the side toward the main face in relation to the center layer. A plurality of resin insulation layers provided on the side toward the back face are formed such that the average of their thicknesses becomes greater than the average of thicknesses of a plurality of resin insulation layers provided on the side toward the main face.

5 Claims, 3 Drawing Sheets

__ US 8,450,617 B2 __

MULTILAYER WIRING SUBSTRATE

CROSS REFERENCE TO RELATED APPLICATIONS

The present application claims priority from Japanese Patent Application No. 2010-247114, which was filed on Nov. 4, 2010, the disclosure of which is herein incorporated by reference in its entirety.

BACKGROUND OF THE INVENTION

1. Field of the Invention

The present invention relates to a multilayer wiring substrate having a multilayer structure in which a plurality of resin insulation layers and a plurality of conductor layers are laminated alternately.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate or the like) formed by impregnating reinforcement fiber with resin. Through utilization of rigidity of the substrate core, resin insulation layers and conductor layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed. Such a multilayer wiring substrate does not use a substrate core, which is relatively thick, thereby reducing the overall wiring length. Thus, the transmission loss of high-frequency signals is lowered, whereby a semiconductor integrated circuit device can be operated at high speed.

However, since the strength of such a substrate is insufficient because of omission of the substrate core, the substrate is apt to warp. In order to avoid such warpage, there has been proposed a multilayer wiring substrate in which some of a plurality of resin insulation layers contain a reinforcement material (refer to, for example, Patent Document 1). Specifically, in the multilayer wiring substrate disclosed in Patent Document 1, an insulation layer containing a reinforcement material is provided at the center of the substrate with respect to the lamination direction, or is provided on each of the top and bottom surfaces of the substrate.

RELATED ART DOCUMENTS

Patent Documents

Patent Document 1 is Japanese Patent Application Laid-open (kokai) No. 2007-96260.

BRIEF SUMMARY OF THE INVENTION

Incidentally, in the case of a multilayer wiring substrate on which an IC chip is mounted, the degree of fineness of wiring patterns increases toward a side on which an IC chip is mounted. In such a multilayer wiring substrate, in order to secure spaces between patterns, the ratio of the area of a conductor layer to that of a corresponding resin insulation layer (copper remaining percentage) is decreased toward the side on which an IC chip is mounted. Since the resin insulation layers and the conductor layers differ in coefficient of thermal expansion, during manufacture of the multilayer wiring substrate, a difference in shrinkage arises between the side on which an IC chip is mounted and the side to which a motherboard is connected, with resultant generation of warpage. In the case of the multilayer wiring substrate disclosed in Patent Document 1, an insulation layer containing a reinforcement material is provided at a position determined, in consideration of the lamination center, such that shrinkage balance is attained. However, this configuration cannot sufficiently eliminate the difference in shrinkage which changes in accordance with the area ratios of the conductor layers.

The present invention has been conceived in view of the above problem, and an object of the invention is to provide a multilayer wiring substrate whose warpage is restrained through reduction of the difference in shrinkage between a main face side on which a chip component is mounted and a back face side opposite the main face side.

A means (Means 1) for solving the above problems is a multilayer wiring substrate having a main face and a back face, a laminate structure in which a plurality of resin insulation layers and a plurality of conductor layers are laminated, and a plurality of main-face-side connection terminals provided on the main face for surface connection of terminals of a chip component. The multilayer wiring substrate includes: a resin insulation layer defining a center layer located at a center in consideration of a number of the plurality of resin insulation layers; of the plurality of conductor layers, back-face-side conductor layers provided on a side toward the back face in relation to the center layer formed such that an average of area ratios of the back-face-side conductor layers becomes greater than an average of area ratios of front-face-side conductor layers provided on a side toward the main face in relation to the center layer; a conductor layer defining a center conductor located at the center in consideration of the number of the plurality of resin insulation layers; and of the plurality of resin insulation layers, back-face-side resin insulation layers provided on the side toward the back face in relation to the center conductor formed such that an average of thicknesses of the back-face-side resin insulation layers becomes greater than an average of thicknesses of front-face-side resin insulation layers provided on the side toward the main face in relation to the center conductor. The plurality of resin insulation layers are made of the same material According to the invention described in Means 1, in a multilayer wiring substrate in which a plurality of resin insulation layers and a plurality of conductor layers are laminated, when a resin insulation layer determined to be located at the center in consideration of the number of resin insulation layers formed of the same material is considered as a center layer, the degree of fineness of wiring patterns of conductor layers increases toward the main face side to which a chip component is surface-connected, and the number of interwiring spaces also increases toward the main face side. Therefore, the average of area ratios of back-face-side conductor layers provided on the back face side becomes greater than the average of area ratios of main-face-side conductor layers provided on the main face side. Notably, the area ratio of a conductor layer is an area ratio (=S1/S2) obtained by dividing a projection area S1 of the conductor layer, which is an area of the conductor layer projected in the lamination direction, by a projection area S2 of the main face (the area of the main face projected in the lamination direction). In the multilayer wiring substrate, if all the resin insulation layers are formed to have the same thickness, since the area ratios of the back-face-side conductor layers are high, the ratio of the resin insulation layers on the main face side becomes greater than that on the back face side. The resin insulation layers shrink to a greater degree as compared with the conductor layers. Therefore, if the ratio of the resin insulation layers provided on the main face side in relation to the center layer differs from the ratio of the resin insulation layers provided on the back face side in relation to the center layer, warpage occurs due to a difference in shrinkage between the two sides. In contrast, in the present invention, of the resin insulation layers made of the same material, a plurality of resin insulation layers provided on the back face side in relation to the center layer are formed such that the average of their thicknesses becomes greater than the average of thicknesses of a plurality of resin insulation layers provided on the side toward the main face in relation to the center layer. Therefore, the difference in shrinkage between the main face side and the back face side can be reduced. As a result, warpage of the multilayer wiring substrate generated due to the difference in shrinkage can be restrained.

Notably, in the multilayer wiring substrate of the present invention, in the case where some of the plurality of resin insulation layers are insulation layers which contain glass cloth and which are low in thermal expansion, the insulation layers containing glass cloth are not counted in the number of the resin insulation layers made of the same material. Also, in the case of a multilayer wiring substrate in which an even number of resin insulation layers are laminated, two resin insulation layers disposed at the center with respect to the lamination direction are considered to serve as a center layer.

Preferably, of the plurality of back-face-side resin insulation layers (the resin insulation layers provided on the side toward the back face), at least one resin insulation layer in contact with a conductor layer functioning as a ground layer is thicker than the front-face-side resin insulation layers (the resin insulation layer provided on the side toward the main face). On the back face side of the multilayer wiring substrate, there is formed a conductor layer having a large area ratio and functioning as a ground layer. By means of forming a resin insulation layer in contact with one side of the ground layer or resin insulation layers in contact with opposite sides of the ground layer to be thicker than the resin insulation layers on the main face side, warpage of the multilayer wiring substrate can be restrained reliably. Notably, preferably, the resin insulation layer in contact with the ground layer is formed to have a thickness which is at least 30% greater than that of the resin insulation layers on the main face side. When this configuration is employed, warpage of the multilayer wiring substrate can be restrained more reliably.

Preferably, of the back-face-side conductor layers (conductor layers provided on the side toward the back face), at least one conductor layer functioning as a ground layer is thicker than the front-face-side conductor layers (conductor layers provided on the side toward the main face). By means of forming the ground layer on the back face side to be thicker than the conductor layers on the main face side, the strength of the wiring substrate is increased, whereby warpage of the wiring substrate can be restrained. In particular, warpage of the wiring substrate can be restrained reliably by means of forming a ground layer provided at a position near the center layer to be thicker. Notably, preferably, the ground layer is formed to have a thickness which is at least 30% greater than that of the conductor layers on the main face side. When this configuration is employed, warpage of the multilayer wiring substrate can be restrained more reliably. Preferably, the ground layer has an area ratio of 80% or higher. When this configuration is employed, a multilayer wiring substrate having an excellent electrical characteristic can be realized.

The plurality of resin insulation layers which partially constitute the multilayer wiring substrate can be selected freely in consideration of electrical insulation performance, heat resistance, humidity resistance, etc. Preferred examples of a polymeric material used to form the resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
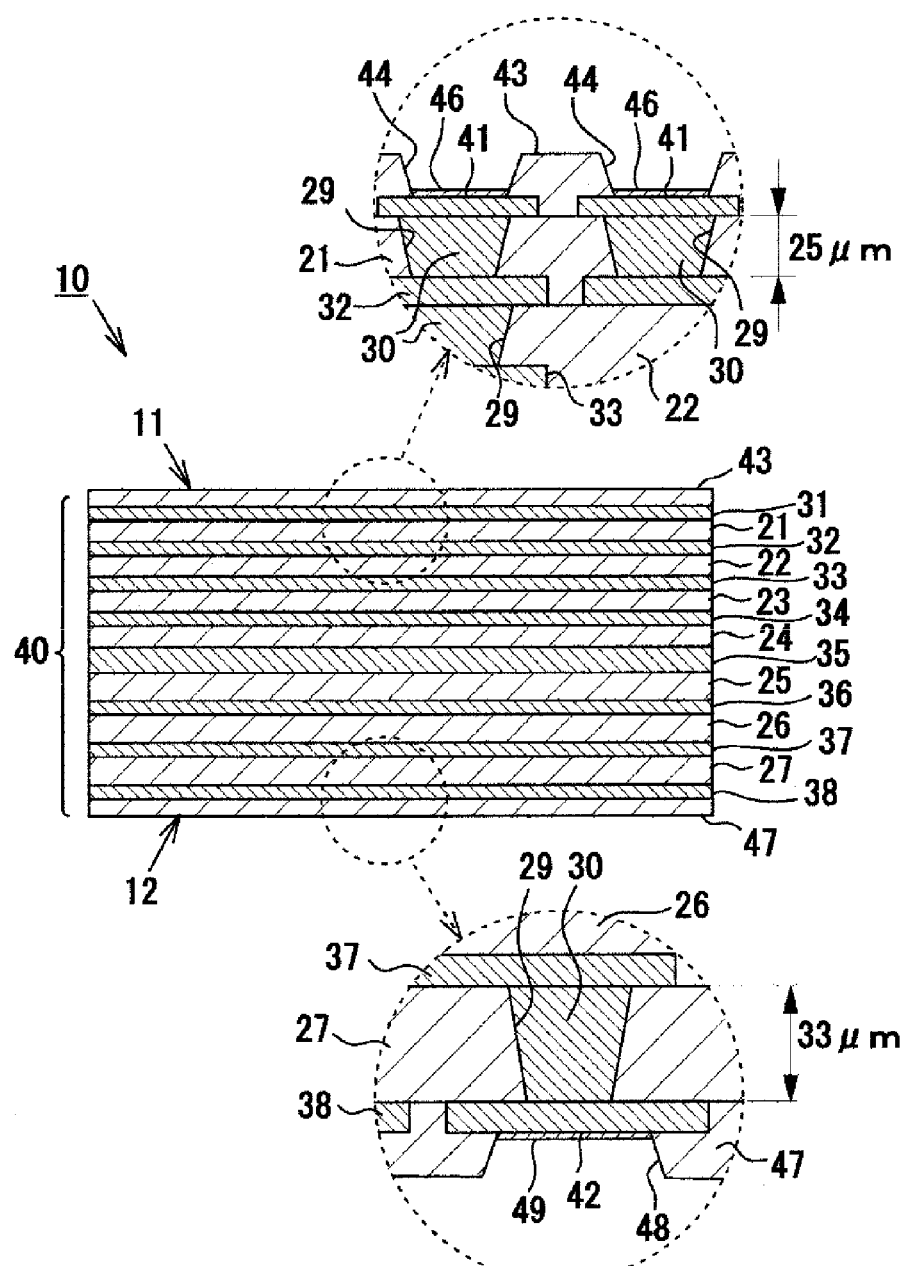
FIG. 1 is a schematic sectional view showing a multilayer wiring substrate according to an embodiment of the present invention.

An embodiment in which the multilayer wiring substrate of the present invention is embodied will next be described in detail with reference to the drawings. FIG. 1 is a sectional view schematically showing the structure of a multilayer wiring substrate 10 according to the present embodiment.

As shown in FIG. 1, the multilayer wiring substrate 10 according to the present embodiment is a wiring substrate for mounting an IC chip. The multilayer wiring substrate 10 has a main face 11 (upper surface in FIG. 1), which serves as an IC-chip mounting face, and a back face 12 (lower surface in FIG. 1) opposite the main face 11. Specifically, the multilayer wiring substrate 10 is a coreless wiring substrate having no substrate core and has a multilayer wiring laminate portion 40 in which resin insulation layers 21, 22, 23, 24, 25, 26, and 27 made primarily of the same resin insulation material, and conductor layers 31, 32, 33, 34, 35, 36, 37, and 38 made of copper are laminated alternately. Notably, the multilayer wiring substrate 10 is formed in the form of a substantially square plate having a thickness of about 0.4 mm, a length of about 40 mm, and a width of about 40 mm. Also, the resin insulation layers 21 to 27 are formed of a build-up material made primarily of a hardened resin insulation material that is not photocurable; specifically, a hardened thermosetting epoxy resin.

A plurality of IC-chip connection terminals 41 (main-face-side connection terminals), to which terminals of an IC chip (chip component) are to be surface-connected, are disposed in an allay on the main face 11 of the multilayer wiring substrate 10. Meanwhile, a plurality of motherboard connection terminals 42, to which a motherboard is to be connected, are disposed in an allay on the back face 12 of the multilayer wiring substrate 10. The motherboard connection terminals 42 are greater in area than the IC-chip connection terminals 41 on the main surface 11. Notably, the IC-chip connection terminals 41 constitute a portion of the conductor layer 31 on the side toward the main face 11. The motherboard connection terminals 42 constitute a portion of the conductor layer 38 on the side toward the back face 12.

On the side of the multilayer wiring substrate 10 toward the main face 11, the substantially entire surface of the outermost resin insulation layer 21 is covered by a solder resist layer 43. The solder resist layer 43 has openings 44 for exposing the IC-chip connection terminals 41. The openings 44 are smaller in diameter than the IC-chip connection terminals 41, and peripheral portions of outer surfaces of the IC-chip connection terminals 41 are buried in the solder resist layer 43. The IC-chip connection terminals 41 are mainly formed of a copper layer. The IC-chip connection terminals 41 have a structure in which only the upper surface of the copper layer, which mainly constitutes the IC-chip connection terminals 41, is covered by a plating layer 46 of a metal other than copper (specifically, nickel-gold plating layer).

On the side of the multilayer wiring substrate 10 toward the back face 12, the substantially entire surface of the outermost resin insulation layer 27 is covered by a solder resist layer 47. The solder resist layer 47 has openings 48 for exposing the motherboard connection terminals 42. The openings 48 are smaller in diameter than the motherboard connection terminals 42, and peripheral portions of outer surfaces of the motherboard connection terminals 42 are buried in the solder resist layer 47. The motherboard connection terminals 42 are mainly formed of a copper layer. The motherboard connection terminals 42 have a structure in which only the lower surface of the copper layer, which mainly constitutes the motherboard connection terminals 42, is covered by a plating layer 49 of a metal other than copper (specifically, nickel-gold plating layer).

Via holes 29 and filled-via conductors 30 are provided in the resin insulation layers 21 to 27. The via conductors 30 are shaped such that their diameters increase in the same direction (in FIG. 1, in the direction from the lower surface side toward the upper surface side). The via conductors 30 electrically interconnect the conductor layers 31 to 38, the IC-chip connection terminals 41, and the motherboard connection terminals 42.

In the multilayer wiring substrate 10 of the present embodiment, the first conductor layer 31 to the eighth conductor layer 38 are formed such that the conductor layers 31 to 38 have respective copper remaining percentages as shown in Table 1. The copper remaining percentage of a conductor layer (31 to 38) refers to an area ratio obtained by dividing a projection area S1 of the conductor layer (31 to 38) (the area of the conductor layer projected in the lamination direction) by a projection area S2 of the main face 11 (the area of the main face projected in the lamination direction) (=S1/S2× 100%). Also, the first resin insulation layer 21 to the seventh resin insulation layer 27, the first conductor layer 31 to the eighth conductor layer 38, and the solder resist layers 43 and 47 are formed to have respective thicknesses as shown in Table 2. Notably, the thickness of each resin insulation layer (21 to 27) refers to the thickness of an insulation layer interposed between corresponding conductor layers (31 to 38).

TABLE 1

|  | Copper remaining % |
| --- | --- |
| 1st conductor layer | 10% |
| 2nd conductor layer | 65% |
| 3rd conductor layer | 70% |
| 4th conductor layer | 70% |
| 5th conductor layer | 85% |
| 6th conductor layer | 80% |
| 7th conductor layer | 75% |
| 8th conductor layer | 90% |

TABLE 2

|  | Thickness |
| --- | --- |
| Solder resist layers | 21 µm |
| 1st resin insulation layer | 25 µm |
| 2nd resin insulation layer | 25 µm |
| 3rd resin insulation layer | 25 µm |
| 4th resin insulation layer | 25 µm |
| 5th resin insulation layer | 33 µm |
| 6th resin insulation layer | 33 µm |
| 7th resin insulation layer | 33 µm |
| 1st conductor layer | 15 µm |
| 2nd conductor layer | 15 µm |
| 3rd conductor layer | 15 µm |
| 4th conductor layer | 15 µm |
| 5th conductor layer | 20 µm |
| 6th conductor layer | 15 µm |
| 7th conductor layer | 15 µm |
| 8th conductor layer | 15 µm |

In the multilayer wiring substrate 10 of the present embodiment, the fourth resin insulation layer 24, which is determined to be located at the center in consideration of the number of the resin insulation layers 21 to 27 made of the same resin insulation material, serves as a center layer. Similarly, the conductor layers 34 and 35, which are determined to be located at the center in consideration of the number of the resin insulation layers 21 to 27, serve as a center conductor. As shown in Table 1, in the multilayer wiring substrate 10, the conductor layers 31, 32, 33, and 34 (main-face-side conductor layers), which are provided on the side toward the main face 11 in relation to the fourth resin insulation layer 24 (center layer), are lower in copper remaining percentage than the conductor layers 35, 36, 37, and 38 (back-face-side conductor layers), which are provided on the side toward the back face 12 in relation to the fourth resin insulation layer 24. Accordingly, the plurality of conductor layers 35 to 38 provided on the side toward the back face 12 are formed such that the average of their copper remaining percentages becomes greater than that of the copper remaining percentages of the plurality of conductor layers 31 to 34 provided on the side toward the main face 11. Notably, in the present embodiment, the conductor layers 35, 36, and 38, whose copper remaining percentages are equal to or greater than 80%, serve as ground layers.

As shown in Table 2, the fourth resin insulation layer 24 (center layer) and the resin insulation layers 21, 22, and 23, ("front-face-side resin insulation layers") which are provided on the side toward the main face 11 in relation to the conductor layers 34 and 35 (center conductor), each have a thickness of 25 μm, and the resin insulation layers 25, 26, and 27, ("back-face-side resin insulation layers") which are provided on the side toward the back face 12 in relation to the conductor electrodes 34 and 35 (center conductor), each have a thickness of 33 μm. That is, in the present embodiment, the resin insulation layers 25, 26, and 27 in contact with the conductor layers 35, 36, and 38, respectively, which function as ground layers on the side toward the back face 12, are thicker than the resin insulation layers 21, 22, and 23 provided on the side toward the main face 11. As described above, in the multilayer wiring substrate 10 of the present embodiment, the plurality of resin insulation layers 25 to 27 provided on the side toward the back face 12 are formed such that the average of their thicknesses is greater than the average of the thicknesses of the plurality of resin insulation layers 21 to 23 provided on the side toward the main face 11.

Moreover, the thicknesses of the conductor layers 31 to 38 are set as follows. The fifth conductor layer 35, which is provided at a position near the center (specifically, provided on the back face 12 side of the fourth resin insulation layer 24, which is the center layer) has a thickness of 20 μm, and each of the remaining conductor layers 31 to 34 and 36 to 38 has a thickness of 15 μm. Each solder resist layer has a thickness of 21 μm.

The thus-configured multilayer wiring substrate 10 is fabricated by, for example, the following procedure.

First, a support substrate (a glass epoxy substrate or the like) having sufficient strength is prepared. On the support substrate, the resin insulation layers 21 to 27 and the conductor layers 31 to 38 are alternately built up, thereby forming the wiring laminate portion 40.

Figure 2:
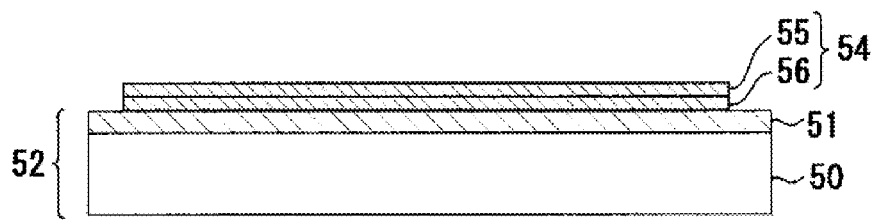
FIG. 2 is an explanatory view showing a method of manufacturing the multilayer wiring substrate.

More specifically, as shown in FIG. 2, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51. Then, a metal laminate sheet 54 is disposed on the upper surface of the ground resin insulation layer 51 of the base material 52. Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 (a pair of metal foils) are separably in close contact with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 3:
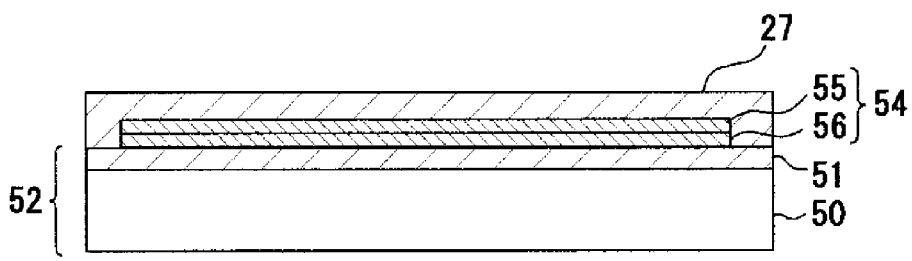
FIG. 3 is an explanatory view showing the method of manufacturing the multilayer wiring substrate.

After that, as shown in FIG. 3, a sheet-like resin insulation layer 27 is disposed on and attached onto the base material 52 in such a manner as to cover the metal laminate sheet 54. This resin insulation layer 27 comes into close contact with the metal laminate sheet 54, and comes into close contact with the ground resin insulation layer 51 in a region around the metal laminate sheet 54, thereby sealing the metal laminate sheet 54.

The via holes 29 are formed in the resin insulation layer 27 at predetermined positions by means of performing laser beam machining by use of, for example, an excimer laser, a UV laser, or a $CO_2$ laser. Next, by use of etchant, such as a potassium permanganate solution, a desmear step is performed for removing smears from inside the via holes 29. In the desmear step, in place of treatment by use of etchant, plasma asking by use of, for example, $O_2$ plasma may be performed.

After the desmear step, electroless copper plating and copper electroplating are performed by a known process, thereby forming the via conductors 30 in the via holes 29. Further, etching is performed by a known process (e.g., semi-additive process), thereby forming the conductor layer 37 in a predetermined pattern on the resin insulation layer 27.

Also, other resin insulation layers 21 to 26 and the corresponding conductor layers 31 to 36 are formed and laminated on the resin insulation layer 27 by processes similar to those used to form the resin insulation layer 27 and the associated conductor layer 37. By the above-described build-up step, there is formed a wiring laminate 60 in which the metal laminate sheet 54, the resin insulation layers 21 to 27, and the conductor layers 31 to 37 are laminated on the base material 52 (see FIG. 4). Notably, a portion of the wiring laminate 60 which is located above the metal laminate sheet 54 will become the wiring laminate portion 40 of the multilayer wiring substrate 10.

Figure 4:
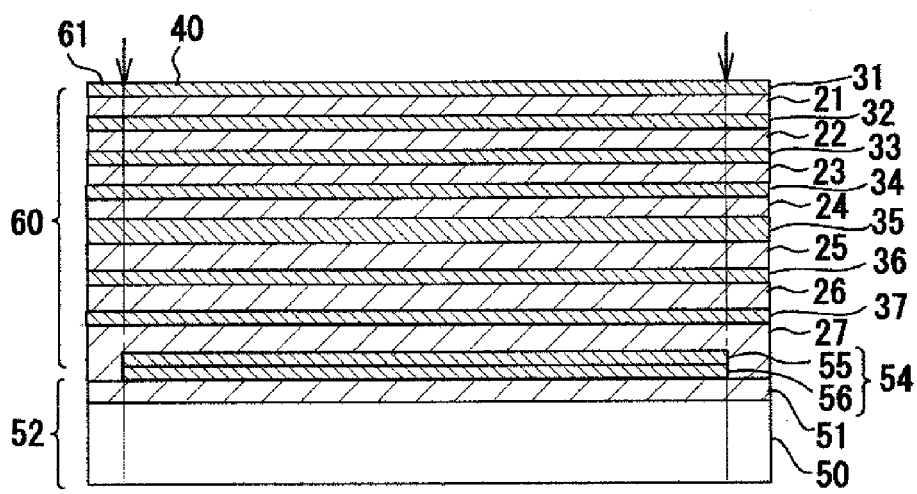
FIG. 4 is an explanatory view showing the method of manufacturing the multilayer wiring substrate.

After that, the wiring laminate 60 is cut by a dicing apparatus (not shown) so as to remove a surrounding portion around the wiring laminate portion 40 (cutting step). At this time, as shown in FIG. 4, the wiring laminate 40 is cut together with the base material 52 (the support substrate 50 and the ground resin insulation layer 51) located under the wiring laminate portion 40, along the boundary (indicated by the arrows in FIG. 4) between the wiring laminate portion 40 and a surrounding portion 61 located around the wiring laminate portion 40. As a result of this cutting, a peripheral edge portion of the metal laminate sheet 54 which has been sealed in the resin insulation layer 27 is exposed. That is, as a result of removal of the surrounding portion 61, a bonded portion between the ground resin insulation layer 51 and the resin insulation layer 27 is lost. Consequently, the wiring laminate portion 40 and the base material 52 are connected together merely through the metal laminate sheet 54.

Figure 5:
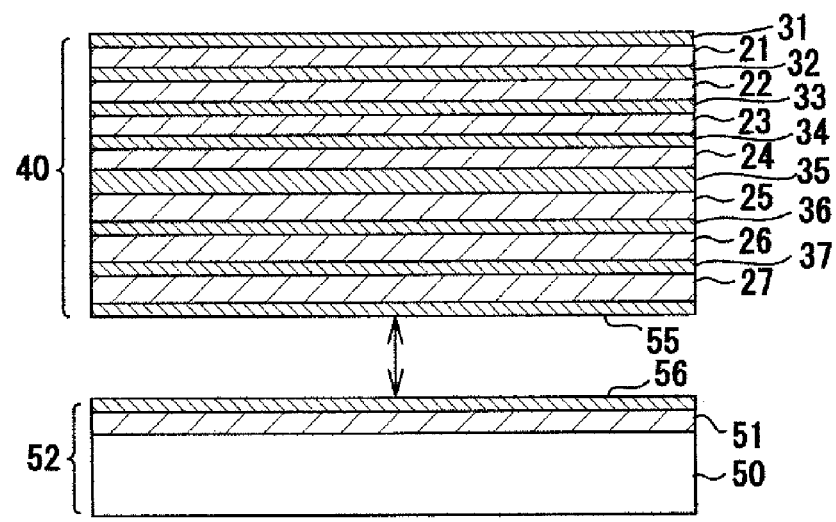
FIG. 5 is an explanatory view showing the method of manufacturing the multilayer wiring substrate.

As shown in FIG. 5, the wiring laminate portion 40 and the base material 52 are separated from each other at the interface between the copper foils 55 and 56 of the metal laminate sheet 54, thereby removing the base material 52 from the wiring laminate portion 40 and exposing the copper foil 55 present on the bottom surface of the wiring laminate portion 40 (the resin insulation layer 27). After that, the copper foil 55 of the wiring laminate portion 40 is patterned by a subtractive method. Specifically, a dry film is laminated on the upper and lower surfaces of the wiring laminate portion 40, and exposure and development are performed for the dry film. Thus, an etching resist layer is formed on the upper surface of the wiring laminate portion 40 such that its covers the entirety of the upper surface, and an etching resist layer having a predetermined pattern corresponding to the motherboard connection terminals 42 is formed on the lower surface of the wiring laminate portion 40. In this state, the copper foil 55 of the wiring laminate portion 40 is etched for patterning, whereby the motherboard connection terminals 42 are formed on the resin insulation layer 27.

Next, photosensitive epoxy resin is applied onto the resin insulation layer 21 and is cured so as to form the solder resist layer 43. Exposure and development are then performed with a predetermined mask placed thereon so as to form the openings 44 in the solder resist layer 43. Similarly, photosensitive epoxy resin is applied onto the resin insulation layer 27 and is cured so as to form the solder resist layer 47. Exposure and development are then performed with a predetermined mask placed thereon so as to form the openings 48 in the solder resist layer 47.

Subsequently, electroless nickel plating and electroless gold plating are successively performed on the surfaces (upper surfaces) of the IC-chip connection terminals 41 exposed from the openings 44, and on the surfaces (lower surfaces) of the motherboard connection terminals 42 exposed from the openings 48. Thus, the nickel-gold plating layers 46 and 49 are formed. Through the above-described steps, the multilayer wiring substrate 10 of FIG. 1 is fabricated.

Figure 6:
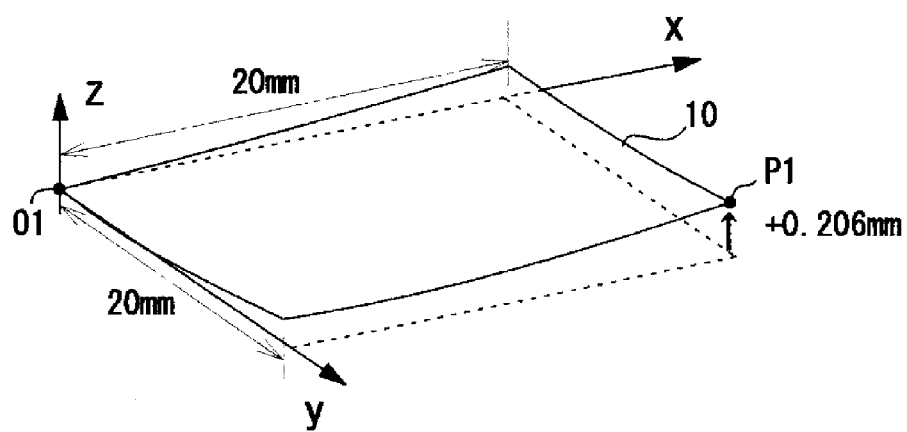
FIG. 6 is an explanatory view showing the amount of warpage of the multilayer wiring substrate.

The present inventors carried out a simulation test so as to check the amount of warpage of the multilayer wiring substrate 10 manufactured as described above. In the test, as shown in FIG. 6, in a ¼ region (20 mm×20 mm) of the multilayer wiring substrate 10, a check was made of the amount of warpage at a corner of the substrate (measuring point P1) in relation to the center of the substrate (reference point O1). Table 3 shows the check results.

Also, a simulation test was performed so as to check the amount of warpage of a multilayer wiring substrate (Example 2) which was identical with the multilayer wiring substrate 10 (Example 1) except that the thickness of the conductor layer 35 was changed to 15 μm. Furthermore, a simulation test was performed so as to check the amount of warpage of a multilayer wiring substrate (Comparative Example 1) which was identical with the multilayer wiring substrate 10 except that the thicknesses of the fifth resin insulation layer 25 to the seventh resin insulation layer 27 were changed to 25 μm and the thickness of the fifth conductor layer 35 was changed to 15 μm, and a simulation test was performed so as to check the amount of warpage of a multilayer wiring substrate (Comparative Example 2) which was identical with the multilayer wiring substrate 10 except that the thicknesses of the fifth resin insulation layer 25 to the seventh resin insulation layer 27 were changed to 25 μm. Table 3 shows the results of checking of the warpage amounts of the multilayer wiring substrates 10 of Examples 1 and 2 and Comparative Examples 1 and 2.

TABLE 3

| | Example 1 | Example 2 | Compara. Example 1 | Compara. Example 2 |
|---|---|---|---|---|
| 1st resin insulation layer | 25 μm | 25 μm | 25 μm | 25 μm |
| 2nd resin insulation layer | 25 μm | 25 μm | 25 μm | 25 μm |
| 3rd resin insulation layer | 25 μm | 25 μm | 25 μm | 25 μm |
| 4th resin insulation layer | 25 μm | 25 μm | 25 μm | 25 μm |
| 5th resin insulation layer | 33 μm | 33 μm | 25 μm | 25 μm |
| 6th resin insulation layer | 33 μm | 33 μm | 25 μm | 25 μm |
| 7th resin insulation layer | 33 μm | 33 μm | 25 μm | 25 μm |
| 1st conductor layer | 15 μm | 15 μm | 15 μm | 15 μm |
| 2nd conductor layer | 15 μm | 15 μm | 15 μm | 15 μm |
| 3rd conductor layer | 15 μm | 15 μm | 15 μm | 15 μm |
| 4th conductor layer | 15 μm | 15 μm | 15 μm | 15 μm |
| 5th conductor layer | 20 μm | 15 μm | 15 μm | 20 μm |
| 6th conductor layer | 15 μm | 15 μm | 15 μm | 15 μm |
| 7th conductor layer | 15 μm | 15 μm | 15 μm | 15 μm |
| 8th conductor layer | 15 μm | 15 μm | 15 μm | 15 μm |
| Warpage of substrate | 206 μm | 219 μm | 306 μm | 297 μm |

As shown in Table 3, in the case of the multilayer wiring substrate of Comparative Example 1, in which all the resin insulation layers 21 to 27 were formed to have the same thickness (25 μm) and all the conductor layers 31 to 38 were formed to have the same thickness (15 μm), the amount of warpage was large (306 μm). Also, in the case of the multilayer wiring substrate of Comparative Example 2, in which all the resin insulation layers 21 to 27 were formed to have the same thickness (25 μm) and only the fifth conductor layer 35 was made thicker (20 μm), the amount of warpage was large (297 μm). In contrast, in the case of the multilayer wiring substrates 10 of Examples 1 and 2, in which the resin insulation layers 25 to 27 located on the side toward the back face 12 were formed to be thicker than the resin insulation layers 21 to 23 located on the side toward the main face 11, the amount of warpage was small (206 μm in Example 1; 219 μm in Example 2), as compared with those of the multilayer wiring substrates of Comparative Examples 1 and 2. In particular, in the case of the multilayer wiring substrate 10 of Example 1, in which the conductor layer 35 was made thicker than the remaining conductor layers 31 to 34 and 36 to 38, the amount of warpage can be restrained to a small amount.

Therefore, the present embodiment can yield the following effects.

(1) In the multilayer wiring substrate 10 of the present embodiment, of the resin insulation layers 21 to 27 made primarily of the same resin insulation material, a plurality of resin insulation layers 25, 26, and 27 provided on the side toward the back face 12 are thicker than a plurality of resin insulation layers 21 to 23 provided on the side toward the main face 11. When this configuration is employed, during manufacture of the substrate, shrinkage on the main face 11 side and the shrinkage on the back face 12 side can be balanced, whereby warpage of the multilayer wiring substrate 10 which arises due to the difference in shrinkage between the two sides can be restrained.

(2) In the multilayer wiring substrate 10 of the present embodiment, of the conductor layers 31 to 38, the conductor layer 35 (ground layer) provided on the side toward the back face 12 to be located near the center layer (resin insulation layer 24) is thicker than the remaining conductor layers 31 to 34 and 36 to 38. By means of forming the conductor layer 35 located at a position near the center layer to have a larger thickness, warpage of the multilayer wiring substrate 10 can be restrained more reliably.

(3) In the multilayer wiring substrate 10 of the present embodiment, each of the resin insulation layer 25, 26, and 27 located on the side toward the back face 12 has a thickness of 33 μm, which is at least 30% greater than the thickness (25 μm) of the resin insulation layers 21 to 23 located on the side toward the main face 11. Furthermore, the fifth conductor layer 35 located at a position near the center layer has a thickness 20 μm, which is at least 30% greater than the thickness (15 μm) of the remaining conductor layers 31 to 34 and 36 to 38. By means of forming the resin insulation layers 25, 26, and 27 and the fifth conductor layer 35 to be thicker, warpage of the multilayer wiring substrate 10 can be restrained reliably.

Notably, the embodiment of the present invention may be modified as follows.

The multilayer wiring substrate 10 of the above-described embodiment is configured such that seven insulation layers (the first resin insulation layer 21 to the seventh resin insulation layer 27) and eight conductor layers (the first conductor layer 31 to the eighth conductor layer 38) are stacked. However, the configuration of the multilayer wiring substrate is not limited thereto, and the number of the resin insulation layers 21 to 27 and the number of conductor layers 31 to 38 may be changed freely. Furthermore, in the multilayer wiring substrate 10, the resin insulation layers 21 to 27 are formed such that the fifth resin insulation layer 25 to the seventh resin insulation layer 27, which are located on the side toward the back face 12 become thicker than the remaining resin insulation layers 21 to 24. However, the configuration of the multilayer wiring substrate is not limited thereto. The present invention requires only that the plurality of resin insulation layers 25 to 27 provided on the side toward the back face 12 in relation to the center conductor (the conductor layers 34 and 35) are formed such that the average of their thicknesses becomes greater than that of the plurality of resin insulation layer 21 to 23 provided on the side toward the main face 11 in relation to the center conductor. Therefore, the resin insulation layer(s) provided on the side toward the back face 12 and formed to have a lager thickness may be freely changed.

In the multilayer wiring substrate 10 of the above-described embodiment, the conductor layers 31 to 38 are formed such that the conductor layer 35 provided on the side toward the back face 12 to be located near the center layer (the resin insulation layer 24) becomes thicker than the remaining conductor layers 31 to 34 and 36 to 38. However, the configuration of the multilayer wiring substrate is not limited thereto. The multilayer wiring substrate 10 may be configured such that the conductor layers 36 and 38 provided on the side toward the back face 12 of the multilayer wiring substrate 10 and functioning as ground layers may be formed to be thicker than the remaining conductor layers.

In the above-described embodiment, the multilayer wiring substrate 10 is manufactured by laminating or stacking the resin insulation layers 21 to 27 and the conductor layers 31 to 38 from the back face 12 side where the motherboard connection terminals 42 are formed. However, the manufacturing method is not limited thereto. The multilayer wiring substrate may be manufactured by laminating or stacking the resin insulation layers 21 to 27 and the conductor layers 31 to 38 from the main face 11 side where the IC-chip connection terminals 41 are formed. In this case, the IC-chip connection terminals 41 are formed through patterning of the copper foil 55. Also, the plurality of conductor layers 31 to 38 formed on the plurality of resin insulation layers 21 to 27 are connected with one another via the via conductors 30 formed such that their diameters increase from the main face 11 side toward the back face 12 side.

Next, technical ideas that the embodiment described above implement are enumerated below.

(1) In Means 1, the multilayer wiring substrate is characterized in that the resin insulation layer in contact with the ground layer provided on the back face side is an insulation layer which is at least 30% thicker than the resin insulation layers provided on the main face side.

(2) In Means 1, the multilayer wiring substrate is characterized in that the ground layer provided on the back face side is a conductor layer which is at least 30% thicker than the conductor layers provided on the main face side.

(3) In Means 1, the multilayer wiring substrate is characterized in that the ground layer provided at a location near the center layer is a conductor layer which is thicker than the remaining conductor layers.

(4) In Means 1, the multilayer wiring substrate is characterized in that the thickest insulation layer among the plurality of resin insulation layers is provided on the back face side.

DESCRIPTION OF REFERENCE NUMERALS

10: multilayer wiring substrate
11: main face of the substrate
12: back face of the substrate
21 to 27: resin insulation layer
31 to 38: conductor layer
41: IC-chip connection terminal (main-face-side connection terminal)

What is claimed is:

1. A multilayer wiring substrate including a main face and a back face, a laminate structure in which a plurality of resin insulation layers and a plurality of conductor layers are laminated, and a plurality of main-face-side connection terminals provided on the main face for surface connection of terminals of a chip component, the multilayer wiring substrate comprising:
a resin insulation layer defining a center layer located at a center in consideration of a number of the plurality of resin insulation layers;
of the plurality of conductor layers, back-face-side conductor layers provided on a side toward the back face in relation to the center layer formed such that an average of area ratios of the back-face-side conductor layers becomes greater than an average of area ratios of front-face-side conductor layers provided on a side toward the main face in relation to the center layer;
a conductor layer defining a center conductor located at the center in consideration of the number of the plurality of resin insulation layers; and
of the plurality of resin insulation layers, back-face-side resin insulation layers provided on the side toward the back face in relation to the center conductor formed such that an average of thicknesses of the back-face-side resin insulation layers becomes greater than an average of thicknesses of front-face-side resin insulation layers provided on the side toward the main face in relation to the center conductor;
wherein the plurality of resin insulation layers are made of the same material.

2. The multilayer wiring substrate according to claim 1, wherein, of the back-face-side resin insulation layers, at least one resin insulation layer in contact with a conductor layer functioning as a ground layer is thicker than the front-face-side resin insulation layers.

3. The multilayer wiring substrate according to claim 1, wherein, of the back-face-side conductor layers provided on the side toward the back face, at least one conductor layer functioning as a ground layer is thicker than the front-face-side conductor layers.

4. The multilayer wiring substrate according to claim 2, wherein the ground layer has an area ratio of 80% or higher.

5. The multilayer wiring substrate according to claim 3, wherein the ground layer has an area ratio of 80% or higher.

* * * * *